(12) United States Patent
Ahn

(10) Patent No.: US 6,522,198 B2
(45) Date of Patent: Feb. 18, 2003

(54) POWER AMPLIFIER HAVING PREDISTORTION LINEARIZER

(75) Inventor: Kwang Eun Ahn, Suwon (KR)

(73) Assignee: LG Electronics Inc., Seoul (KR)

( * ) Notice: Subject to any disclaimer, the term of this patent is extended or adjusted under 35 U.S.C. 154(b) by 80 days.

(21) Appl. No.: 09/735,530

(22) Filed: Dec. 14, 2000

(65) Prior Publication Data
US 2001/0052816 A1 Dec. 20, 2001

(30) Foreign Application Priority Data
Dec. 15, 1999 (KR) .............................. 99-57976

(51) Int. Cl.[7] .............................. H03F 1/30; H03F 1/00
(52) U.S. Cl. ........................................ 330/149; 330/151
(58) Field of Search ................................ 330/149, 151

(56) References Cited

U.S. PATENT DOCUMENTS 5,768,699 A * 6/1998 Behan et al. ............... 330/151
6,028,477 A * 2/2000 Gentzler ..................... 330/149
6,078,216 A * 6/2000 Proctor, Jr. ................. 330/149
6,111,462 A * 8/2000 Mucenieks et al. ......... 330/149
6,359,508 B1 * 3/2002 Mucenieks .................. 330/149

* cited by examiner

Primary Examiner—Patricia Nguyen
(74) Attorney, Agent, or Firm—Fleshner & Kim, LLP

(57) ABSTRACT

A power amplifier having a predistortion linearizer for improving the non-linear property of the power amplifier is disclosed. The powers amplifier includes a predistorter for outputting a distortion compensating signal to the high power amplifier, a delay line for delaying an input signal for a prescribed period of time and outputting a reference signal, a distortion component detection circuit for detecting a distortion component by comparing the output signal of the power amplifier with the reference signal of the delay line, and an adaptive controller for controlling the properties of the predistorter in order to minimize the detected distortion component.

26 Claims, 4 Drawing Sheets

REFERENCE SIGNAL(R)

OUTPUT SIGNAL(M) OF POWER AMPLIFER

POWER AMPLIFIER HAVING PREDISTORTION LINEARIZER

BACKGROUND OF THE INVENTION

1. Field of the Invention

The present invention relates to a power amplifier, and more particularly, to a power amplifier having a predistortion linearizer for improving a linearity of the power amplifier.

2. Background of the Related Art

Generally, a power amplifier has a non-linear property in which, as the number of input signals is increased, a gain of the amplifier is reduced and a phase thereof is delayed. Thus, in order to improve the non-linearity of the power amplifier, a wide variety of linearization techniques and algorithms have been developed. These include predistortion, envelope feedback, and feedforward. The predistortion method has been widely employed in mobile communication base stations since it has a simple structure and an excellent efficiency as compared to the feedfoward method. Additionally, unlike the envelope feedback method the predistortion method has no bandwidth limit.

FIG. 1 illustrates a related art power amplifier having a predistortion linearizer. As illustrated in FIG. 1, the related art power amplifier having a predistortion linearizer includes a power amplifier 14, a predistorter 12 for improving the non-linearity of the power amplifier 14, and a directional coupler 16 for sampling the output signal of the power amplifier 14. The device also includes a distortion component detection unit 20 for separating a distortion component from the sampled output signals and a power detector 22 determining the amount of the distortion components in the sample. An adaptive controller 24 is additionally provided for controlling the properties of the predistorter 12 according to the amount of the detected distortion components detected in the power detector 22.

The distortion detection unit 20 includes a mixer 20-1 for down-converting the output signal and a band pass filter (BPF) 20-2 for filtering the output of the mixer 20-1 and separating the distortion component from the output signal.

The operation of the related art power amplifier having a predistortion linearizer thusly constructed will now be described with reference to the accompanying drawings.

When an output signal is inputted through an input port 10, the predistorter 12 changes the gain and phase of the input signal to counteract the non-linear properties of the power amplifier 14. That is, the input signal is modified to minimize the non-linear property of the power amplifier 14. In addition, the input signal whose gain and phase are changed is amplified in the power amplifier 14, and then is outputted through an output port 18.

If the predistorter 12 operates normally, the output signal of the power amplifier 14 will have no distortion component. However, because it is so difficult to set the property of the predistorter 12 such that it has exactly the inverse of the non-linear property of the power amplifier 14, a distortion component appears in the output signal.

Therefore, in order to minimize the distortion component of the output signal, the adaptive controller 24 periodically checks the generated amount of distortion components detected in the power detector 22. The adaptive controller 24 then changes the properties of the predistorter 12 in order to minimize the generated amount of distortion components. Specifically, the distortion components are separated from the output signal, as shown in deviated crease line of FIG. 2. This is done by down-converting (RFout-LO) the output signal using the mixer 20-1, and thereafter passing the same through the BPF 20-2. Therefore, the power detector 22 determines the generated amount of the distortion component upon receipt of the distortion component separated from the BPF 20-2 and produces an output signal.

As described above, the related art power amplifier has various problems. For example, a distortion component is detected from the down-converted signal using the BPF 20-2. At this time, the output signal of the ideal BPF does not contain an input signal component to be amplified. Because the attenuation property of the filter is restricted, only the input signal component appears in the output of the BPF 20-2.

Additionally, in order for the detected distortion component to be used in the adaptive controller 22, the amplitude of the input component must be smaller than that of the distortion component by more than 15 dB. As a result, considering that the amplitude of the distortion component of a general power amplifier is smaller than that of the input component by approximately 30 dB, the BPF 20-2 has to attenuate the input signal component by more than 45 dB. Thus, in the related art, there is a problem that the attenuation property of the filter must be excellent in order to greatly improve the distortion property appearing in the output of the power amplifier.

Furthermore, the distortion component generated in the power amplifier 14 is mainly composed of third IMD (Intermodulation distortion). However, as illustrated in FIG. 2, there is a disadvantage that it is very difficult to filter the third IMD because it is directly adjacent to the original input component.

Moreover, the related art changes a center frequency of a local oscillation carrier (LO) and performs a down-conversion with respect to the changed center frequency of the local oscillation carrier (LO) in order to maintain the constant center frequency of the BPF 20-2. For this, accurate center frequency information of the input signal is required. However, in the case that the accurate frequency information is not acquired, additional modules for checking the frequency of the input signal are needed.

SUMMARY OF THE INVENTION

It is an object of the present invention to provide a power amplifier having a predistortion linearizer that substantially obviates problems due to disadvantages in the prior art.

It is another object of the present invention to provide a power amplifier having a predistortion linearizer capable of reducing the non-linear property of the power amplifier.

It is another object of the present invention to provide a distortion component detection circuit for a power amplifier capable of accurately detecting a distortion component irrespective of the frequency and properties of an input signal.

To achieve at least the above objects in whole or in parts, there is provided a power amplifier having a predistortion linearizer, which includes a predistorter for outputting a distortion compensating signal to the power amplifier; a delay line for delaying an input signal for a predetermined time and generating a reference signal; a distortion component detection circuit for detecting a distortion component by comparing the output signal of the power amplifier with the reference signal of the delay line; and an adaptive controller for controlling the properties of the predistorter in order to minimize the detected distortion component. The above distortion component detection circuit adjusts the output signal so that it has the same amplitude as the reference signal and the phase difference between the output signal and the reference signal is 180 degrees, and thereafter separates distortion components from the output signal of the power amplifier by vector operation of the output signal and the reference signal.

To further achieve the above objects in whole or in parts, there is provided a distortion component detection circuit having a vector modulator for controlling the gain and phase of an output signal; a branch line coupler for receiving an output signal and reference signal of the vector modulator and adding vector components of both signals; a 2-way combiner for combining outputs of the branch line coupler and outputting a distortion component; and a control signal generator for producing the difference in gain and phase by computing the output signal and reference signal of the vector modulator, the output signal of the branch line coupler, and the power of the distortion component and outputting the control voltage proportional to the difference in the outputted gain and phase to the vector modulator.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
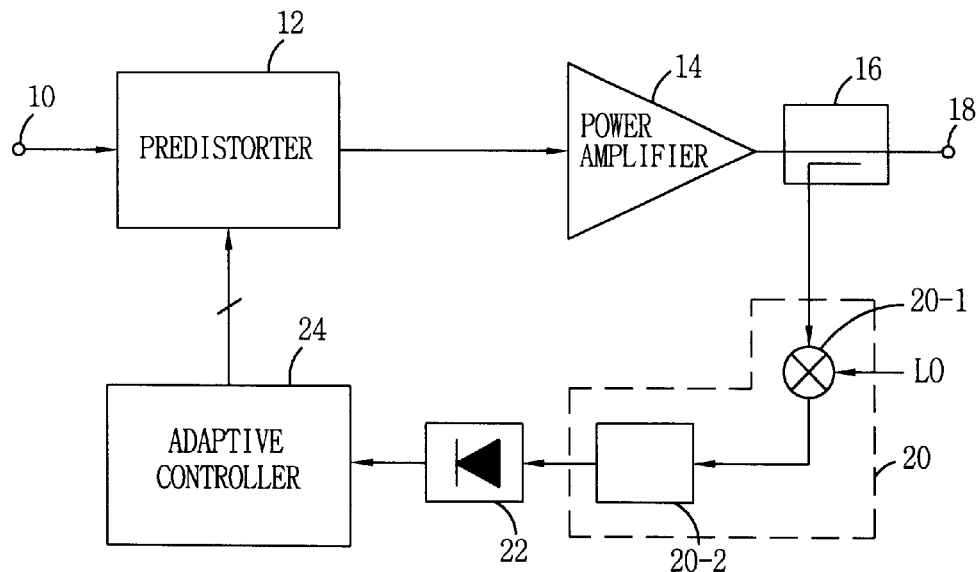
FIG. 1 is a diagram illustrating a power amplifier having a predistortion linearizer in the related art.
Figure 2:
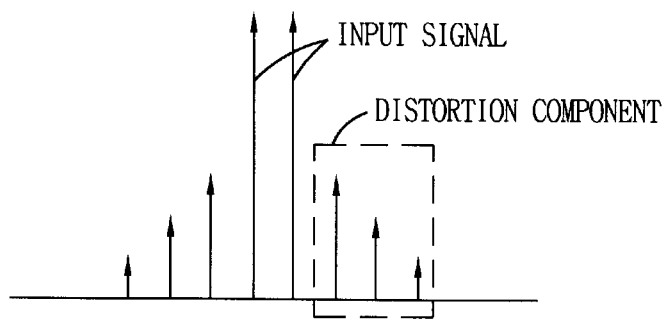
FIG. 2 is a diagram illustrating a distortion signal contained in an output signal of the power amplifier of FIG. 1.
Figure 3:
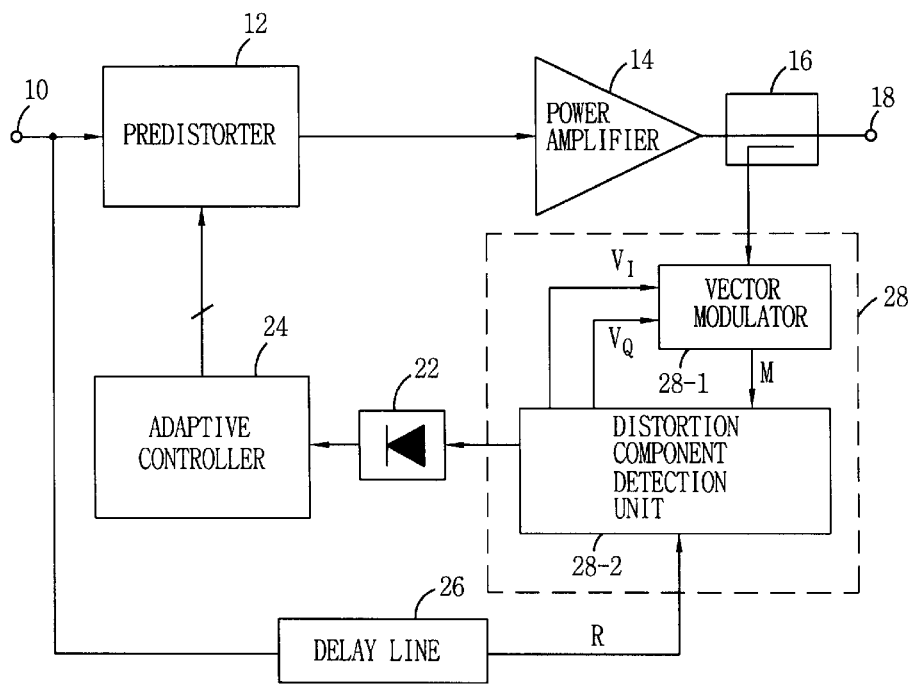
FIG. 3 is a diagram illustrating a power amplifier having a predistortion linearizer in accordance with a preferred embodiment of the present invention.

Referring to FIG. 3, a power amplifier having a predistortion linearizer in accordance with a preferred embodiment of the present invention is illustrated. It includes a predistorter 12, a power amplifier 14, and a directional coupler 16. It further includes a power detector 22 and an adaptive controller 24. These elements are similar to those of the related art and have thus been identified with the same reference numerals. Next, the device includes a delay line 26, and a distortion component detection circuit 28.

The delay line 26 outputs a reference signal R by delaying an input signal for a prescribed period of time, and the distortion component detection circuit 28 outputs a distortion component by adjusting an output signal M of the power amplifier 14. The distortion component is such that it has the same amplitude as the reference signal R and the phase difference between the reference signal and the output signal is 180 degrees. Since the operation of the other portions is similar to the related art, the detailed description thereof is omitted.

The distortion component detection circuit 28 includes a vector modulator 28-1, and a distortion component detection unit 28-2 coupled to receive the output signal M of the power amplifier 14 and reference signal R, and detect a distortion component. The distortion component detection unit 28-2 outputs gain and phase control voltages $V_I$ and $V_Q$ to the vector modulator 28-1.

Figure 4:
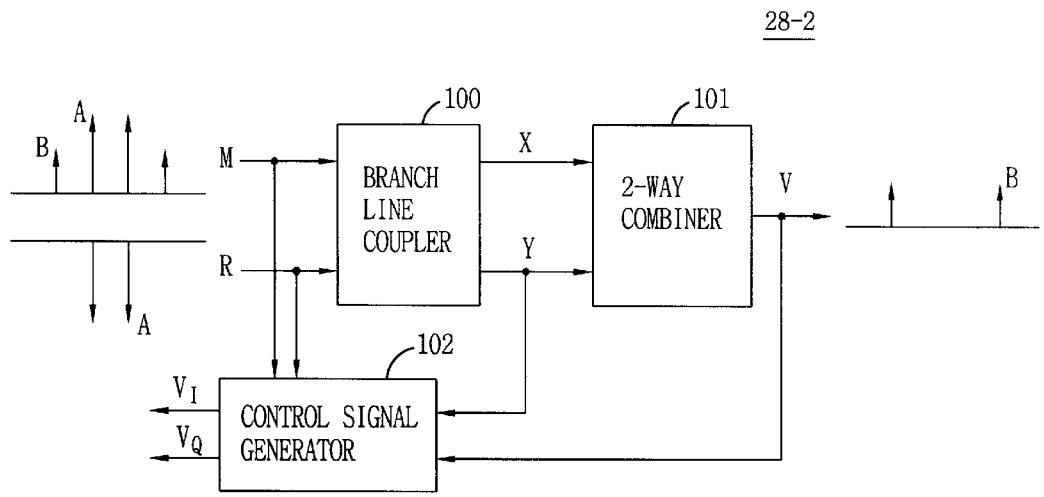
FIG. 4 is a diagram illustrating a distortion component detection unit of FIG. 3.

Referring to FIG. 4, the distortion component detection unit 28-2 includes a branch line coupler 100 to receive the output signal M and the reference signal R. It further includes a 2-way combiner 101 coupled to receive the output signals X, Y of the branch line coupler. Additionally, it includes a control signal generator 102 which receives an output signal V of the two way combiner 101, an output signal Y of the branch line coupler 100, the output signal M, and the reference signal R.

The operation of the thusly constructed power amplifier having a predistortion linearizer in accordance with the present invention will now be described with reference to the accompanying drawings.

Figure 5A:
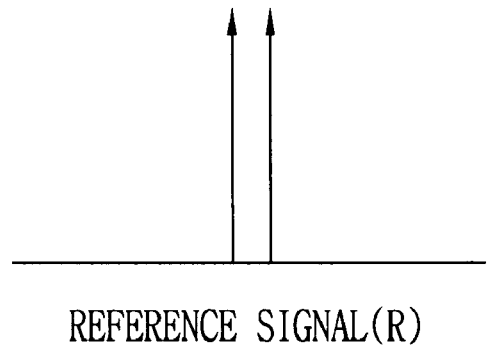
FIG. 5A is a diagram illustrating the reference signal generated by the power amplifier having a predistortion linearizer of FIG. 3.
Figure 5B:
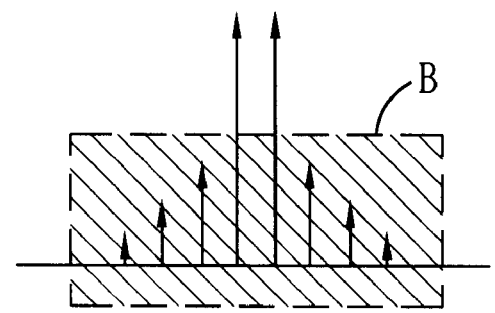
FIG. 5B is a diagram illustrating the distortion component of the output signal of the power amplifier having a predistortion linearizer of FIG. 3.

As illustrated in FIG. 5A, the distortion component detection circuit 28 receives the reference signal R outputted from the delay line 26, as well as the output signal M of the power amplifier. The distortion component detection circuit 28 separates a distortion component B from the output signal M of the power amplifier 14, as illustrated in FIG. 5B, by adjusting the output signal M so that it has the same amplitude as the reference signal R and a phase difference between the reference signal R and the output signal M of 180 degrees.

As illustrated in FIG. 4, the branch line coupler 100 of the distortion component detection unit 28-2 adjusts the path of the two inputted signals M and R. At this time, M a is a signal in which a part of the output of the power amplifier 14 is sampled to have the same amplitude as the reference signal R, and R is the input signal that is delayed in the delay line 26 so that it has a phase difference of 180 degrees from the signal M.

Figure 6A:
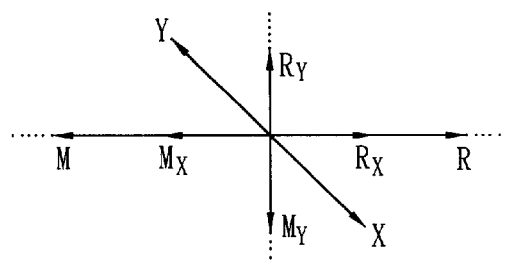
FIGS. 6A–6D illustrate signals on each port of the distortion component detection unit of FIG. 3 represented as vector components.

Therefore, when there is no difference in amplitude and phase between the two signals M and R, components A of the two signals M and R are represented as vectors as illustrated in FIG. 6A. The outputs of the branch line coupler with respect to the vectors M and R are $M_X$, $M_Y$, $R_X$, and $R_Y$. Signal X is a resultant vector of $M_Y$ and $R_X$, and signal Y is a resultant vector of $M_X$ and $R_Y$. However, because the output V of the 2-way combiner 101 is a resultant vector of signals X and Y, the output V of the 2-way combiner 101 becomes 0 if there is no difference in amplitude and phase generated between M and R. Thus only the distortion component B generated in the power amplifier 14 appears.

Figure 6B:
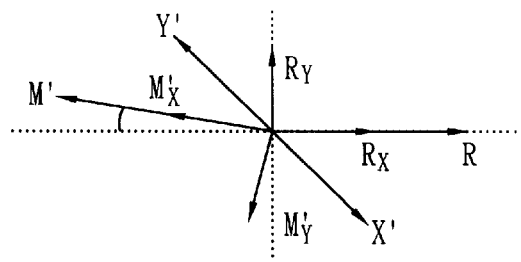
Figure 6C:
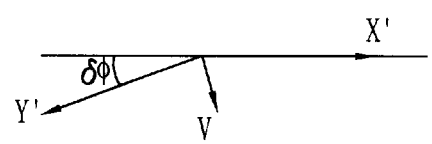

A difference in amplitude and phase is generated between M and R due to the non-linearity of the power amplifier 14. In such an instance, the components A of signals M and R are represented as vectors, as shown in FIG. 6B. The output V of the 2-way combiner 101 is thus represented as a resultant vector V of X' and Y', as shown in FIG. 6C. The control signal generator 102 accordingly detects the signals M and R, and the power Y of the branch line coupler 100 and the power V of the 2-way combiner 101. It then produces the difference in amplitude and phase.

V, a resultant vector of X' and Y' in FIG. 6C can be represented as the following Expression 1.

$$V^2 = X'^2 + Y'^2 - 2X'Y' \cos(\pi - \delta\Phi) \quad \text{Equation 1}$$

$\delta\Phi$ is a phase difference generated in the power amplifier 14.

Additionally, in order to express the difference in amplitude generated in the power amplifier 14, the above equation 1 can be represented as the following Equation 2.

$$V^2 = X'^2 + (X' + \delta A)^2 - 2X'(X + \delta A)\cos(\pi - \delta\Phi) \quad \text{Equation 2}$$

In FIG. 4, the output signal M of the power amplifier 14 can be represented as the sum of the input signal R and distorted the component V, so the difference in amplitude can be obtained by the following Equation 3.

$$\text{Amplitude difference} = P_M - (P_R + 2P_V) \quad \text{Equation 3}$$

At this time, $P_M$, $P_R$, and $2P_V$ are powers of M, R, and V, which are represented as follows.

$$P_M = (A^2 + B^2)$$

$$P_R = (A + \delta A)^2$$

$$P_V = \frac{1}{2}\{A^2 + (A + \delta A)^2 - 2A(A + \delta A)\cos(\pi - \delta\Phi) + B^2\}$$

Thus, Equation 3 results in the following Equation 4 by the above term.

$$\text{Amplitude difference} = -2(A + \delta A)[A(1 - \cos \delta\Phi) + \delta A] \approx -2A\delta A \text{ if } A >> \delta\Phi \approx 0 \quad \text{Equation 4}$$

Phase difference is obtained by the definition that the sum of the two input powers $P_M$ and $P_R$ of the branch line coupler 100 is two times the output power of the branch line coupler 100.

$$\text{Phase difference} = P_M + P_R - 2P_Y \quad \text{Equation 5}$$

Figure 6D:
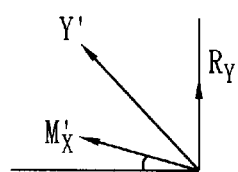

As illustrated in FIG. 6D, $P_Y$ is obtained from Y'. Y' and $P_Y$ are expressed as follows.

$$Y'^2 = R_Y^2 + M'_X^2 - 2R_Y M'_X \cos(\pi/2 - \delta\Phi)$$

$$P_Y = \frac{1}{2}\{A^2 + (A + \delta A)^2 - 2A(A + \delta A)\cos(\pi/2 - \delta\Phi) + B^2\}$$

Thus, Equation 5 results in the following Equation 6 by the above terms.

$$\text{Amplitude difference} = -2A(A + \delta A)\sin \delta\Phi \approx -2A^2 \delta\Phi \text{ if } \delta A << A, \delta\Phi, << 1 \quad \text{Equation 6}$$

Thus, the control signal generator 102 generates control voltages $V_I$ and $V_Q$ proportional to the difference in amplitude and phase, and outputs the same to the vector modulator 28-1. The vector modulator 28-1 adjusts the gain and phase of the output signal M so that it has the same amplitude as the reference signal and a phase difference between the output signal and the reference signal of 180 degrees.

If the output signal M has the same amplitude as the reference signal R and the phase difference therebetween is 180 degrees, only the distortion components B are separated in the distortion component detection unit 28-2. The power detector 22 thus detects only the generation amount of distortion components based on the separated distortion components. Therefore, the adaptive controller 24 controls the predistorter 12 so that the generation amount of distortion components detected in the power detector 22 is minimized, thereby improving the non-linear property of the power amplifier 14.

As described herein, the power amplifier having a predistortion linearizer in accordance with the present invention detects a distortion component by adjusting an output signal of the power amplifier so that the output signal has the same amplitude as an input signal and the phase difference therebetween is 180 degrees. It therefore compensates the non-linear property of the power amplifier according to the detected distortion component. Consequently, the present invention has an advantage that a distortion component can be accurately detected regardless of the frequency of the signal inputted into the power amplifier, and the properties of the filter, and the non-linear property of the power amplifier can be greatly improved by the accurate detection of the distortion component.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A power amplifier, comprising:
   a predistorter configured to receive an input signal and output a distortion compensating signal;
   a power amplifier coupled to receive the distortion compensating signal and generate an output signal;
   a delay line coupled to receive the input signal and generate a reference signal;
   a distortion component detection circuit coupled to receive the output signal from the power amplifier and the reference signal from the delay line, and detect a distortion component of the output signal to generate a distortion level output signal; and
   an adaptive controller coupled to receive the distortion level output signal and generate a control signal to control the predistorter.

2. The power amplifier of claim 1, wherein the distortion component detection circuit detects a distortion component by adjusting the output signal so that the output signal and the reference signal have the same amplitude and a phase difference of 180 degrees.

3. The power amplifier of claim 1, wherein the reference signal is formed by inverting the phase of the input signal by 180 degrees.

4. The power amplifier of claim 1, wherein the distortion component detection circuit comprises:
   a vector modulator coupled to receive the output voltage and a feedback signal to control at least one of the gain and phase of the output signal; and
   a distortion component detection unit coupled to receive an output of the vector modulator and the reference signal, detect the distortion component of the output signal by comparing the output signal with the reference signal, and output the feedback signal corresponding to a difference in gain and phase to the vector modulator.

5. The power amplifier of claim 4, wherein the feedback signal is a voltage control signal.

6. The power amplifier of claim 4, wherein the distortion component detection unit comprises:
- a branch line coupler to add vector components of the output signal and reference signal;
- a 2-way combiner to combine outputs of the branch line coupler and output the distortion component; and
- a control signal generator coupled to receive the output signal of the vector modulator, the reference signal, the output signal of the branch line coupler, and a power signal of the distortion component to produce the feedback signal proportional to a difference in the outputted gain and phase of the reference signal and the output signal.

7. The power amplifier of claim 6, wherein the distortion component detection unit further comprises a power detector configured to detect and output a power of the distortion component.

8. The power amplifier of claim 1, wherein the delay line delays the input signal for a prescribed period of time to generate the reference signal.

9. The power amplifier of claim 1, wherein the distortion component detection circuit compares the output signal to the reference signal to generate the distortion level output signal.

10. A distortion component detection circuit for a power amplifier, comprising:
- a delay line coupled to delay an input signal for a prescribed period of time to generate a reference signal;
- a vector modulator coupled to receive an output signal of a power amplifier and a control voltage feedback signal to control a gain and phase of the output signal; and
- a distortion component detection unit coupled to receive an output of the vector modulator and detect a distortion component of the output signal by computing vector components of the output signal and the reference signal, and outputting the control voltage feedback signal corresponding to a difference in gain and phase between the reference signal and the output signal to the vector modulator.

11. The circuit of claim 10, wherein the reference signal is formed by inverting the phase of the input signal.

12. The circuit of claim 10, wherein the distortion component detection unit comprises:
- a branch line coupler configured to add vector components of the output signal and reference signal;
- a 2-way combiner configured to add vector outputs of the branch line coupler and output the distortion component; and
- a control signal generator coupled to receive the output signal, the reference signal, the output of the branch line coupler, and a power signal of the distortion component, to output the control voltage feedback signal.

13. The circuit of claim 12, further comprising a power detector coupled to receive the distortion component and generate a distortion component power signal.

14. The circuit of claim 10, further comprising an adaptive controller coupled to receive an output of the distortion component detection circuit and generate a control signal to control the output signal.

15. A distortion component detection circuit for a power amplifier, comprising:
- a delay line to delay an input signal for a prescribed time period and generate a reference signal;
- a vector modulator coupled to receive an output signal of the power amplifier and a control voltage feedback signal to control a gain and phase of the output signal of the power amplifier;
- a branch line coupler to receive an output signal of the vector modulator and the reference signal and add vector components of both signals;
- a 2-way combiner to combine vector outputs of the branch line coupler and output a resultant distortion component; and
- a control signal generator to calculate a difference in gain and phase of the output signal of the vector modulator and reference signal by receiving the vector modulator output signal, the reference signal, the vector output signal of the branch line coupler, and a power signal of the distortion component and outputting the control voltage feedback signal proportional to the calculated difference.

16. The circuit of claim 15, further comprising a power detector coupled to receive the distortion component and generate a distortion component power signal.

17. The circuit of claim 15, further comprising an adaptive controller coupled to receive an output of the 2-way combiner and generate a control signal to control the non-linear aspects of the power amplifier.

18. A method of adaptively controlling the linearity of a power amplifier, comprising:
- generating a reference signal by phase shifting an input signal;
- generating an amplified signal by amplifying the input signal with a power amplifier;
- identifying a distortion component of the amplified signal by combining vector components of the reference signal and the amplified signal to form a resultant distortion component;
- generating a control signal based on the identified level of the resultant distortion component;
- controlling the non-linear effects of the power amplifier using the control signal.

19. The method of claim 18, wherein the step of identifying the distortion component comprises:
- adjusting the amplified signal with a vector modulator to have a same amplitude as the reference signal, and a 180 degree phase difference;
- combining vector components of the amplified signal and the reference signal to isolate a resultant distortion component;
- generating gain and phase control voltages to control the vector modulator; and
- outputting a control signal based on a power level of the distortion component.

20. A method of separating a distortion component from an amplified signal, comprising:
- generating an output signal by amplifying an input signal;
- generating a reference signal by delaying the input signal, wherein the reference signal is 180 degrees phase shifted from the input signal;
- adjusting the output signal to have the same amplitude as the reference signal; and
- combining vector components of the output signal with vector components of the reference signal to generate a resultant distortion component signal.

21. The method of claim 20, wherein the step of combining the output signal with the reference signal comprises adding vector components of the output signal with vector components of the reference signal.

22. The method of claim 20, wherein the step of combining the vector components of the output signal with vector components of the reference signal comprises generating a first branch line vector signal equivalent to a resultant vector of a first vector of the output signal and a first vector of the reference signal, generating a second branch line vector signal equivalent to a resultant vector of a second vector of the output signal and a second vector of the reference signal, and combining the first and second branch line vector signals to form the resultant distortion component signal equivalent to a resultant vector of the first and second branch line vector signals.

23. The method of claim 20, further comprising providing the distortion component signal to a power detector to detect an amount of distortion and generate a first control signal, and providing the first control signal to an adaptive controller to generate a second control signal, wherein the second control controls non-linear effects of a power amplifier.

24. The method of claim 23, wherein the second control signal is provided to a predistorter that preconditions the input signal, and the preconditioned input signal is amplified to generate the output signal, and wherein the non-linear effects of the amplifier are minimized in accordance with the preconditioned input signal.

25. The circuit of claim 10, wherein the output of the vector modulator and the reference signal have a same amplitude and a phase difference of 180 degrees.

26. The circuit of claim 15, wherein the output signal of the vector modulator and the reference signal have a same amplitude and a phase difference of 180 degrees.

* * * * *